(12) United States Patent
Kudo

(10) Patent No.: US 10,032,941 B2
(45) Date of Patent: Jul. 24, 2018

(54) METHOD OF MANUFACTURING PHOTOELECTRIC CONVERSION ELEMENT, PHOTOELECTRIC CONVERSION ELEMENT, AND PHOTOELECTRIC CONVERSION DEVICE

(71) Applicant: Seiko Epson Corporation, Tokyo (JP)

(72) Inventor: Manabu Kudo, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/363,199

(22) Filed: Nov. 29, 2016

(65) Prior Publication Data
US 2017/0179311 A1 Jun. 22, 2017

(30) Foreign Application Priority Data
Dec. 18, 2015 (JP) .................. 2015-248014

(51) Int. Cl.
*H01L 31/103* (2006.01)
*H01L 31/0224* (2006.01)
*H01L 31/18* (2006.01)
*H01L 31/0232* (2014.01)

(52) U.S. Cl.
CPC .......... *H01L 31/022408* (2013.01); *H01L 31/02327* (2013.01); *H01L 31/022475* (2013.01); *H01L 31/103* (2013.01); *H01L 31/1804* (2013.01)

(58) Field of Classification Search
CPC ....... H01L 31/022475; H01L 31/02327; H01L 31/103; H01L 31/1804
See application file for complete search history.

(56) References Cited

U.S. PATENT DOCUMENTS

| 2008/0237474 | A1* | 10/2008 | Tonotani ............. G01T 1/2018 250/363.01 |
| 2011/0018081 | A1* | 1/2011 | Wu ................. H01L 31/022408 257/432 |
| 2011/0291221 | A1* | 12/2011 | Yamabi .......... H01L 31/022408 257/461 |
| 2014/0103347 | A1 | 4/2014 | Ishino |
| 2015/0102449 | A1 | 4/2015 | Kudo |
| 2015/0344359 | A1* | 12/2015 | Kawasaki ............... C03C 17/32 524/606 |

(Continued)

FOREIGN PATENT DOCUMENTS

| JP | 2009-289574 A | 12/2009 |
| JP | 2009-289575 A | 12/2009 |

(Continued)

*Primary Examiner* — Nathan W Ha
(74) *Attorney, Agent, or Firm* — Harness, Dickey & Pierce, P.L.C.

(57) ABSTRACT

A method of manufacturing a photoelectric conversion element including a semiconductor layer includes: forming an electrode; forming an insulating layer covering the electrode; forming an opening in a region of the insulating layer overlapping the electrode in a plan view; forming a covering layer of a semiconductor material on a surface of the insulating layer; and forming the semiconductor layer by patterning the covering layer. In the forming of the semiconductor layer, the semiconductor layer is formed such that an outer circumferential edge of the semiconductor layer is located on the outside of an inner circumferential edge of the opening in the plan view.

2 Claims, 6 Drawing Sheets

(56) References Cited

U.S. PATENT DOCUMENTS

| | | | |
|---|---|---|---|
| 2015/0348975 A1* | 12/2015 | Tamura | H01L 27/1052 257/43 |
| 2015/0351168 A1* | 12/2015 | Yasumoto | B32B 7/12 428/216 |
| 2015/0380673 A1* | 12/2015 | Ito | H01L 51/524 257/99 |
| 2016/0064460 A1* | 3/2016 | Kim | H01L 31/02327 257/40 |
| 2016/0163747 A1* | 6/2016 | Koide | H01L 27/1443 257/80 |

FOREIGN PATENT DOCUMENTS

| | | |
|---|---|---|
| JP | 2014-078651 A | 5/2014 |
| JP | 2015-079840 A | 4/2015 |

\* cited by examiner

< STEP P4 >

< STEP P5 >

< STEP P6 >

< STEP P_A >

METHOD OF MANUFACTURING PHOTOELECTRIC CONVERSION ELEMENT, PHOTOELECTRIC CONVERSION ELEMENT, AND PHOTOELECTRIC CONVERSION DEVICE

BACKGROUND

1. Technical Field

The present invention relates to a photoelectric conversion technique.

2. Related Art

Techniques for detecting light using a photoelectric conversion element including a semiconductor layer have been proposed in the related art. For example, JP-A-2014-78651 discloses a photoelectric conversion element in which a photoelectric conversion layer intervenes between a lower electrode and an upper electrode. In the manufacturing process of the photoelectric conversion element, a conductive layer serving as the lower electrode of the photoelectric conversion element is first formed over the entire face of a substrate, and a covering layer of a semiconductor material is formed on the surface of the conductive layer. Then, the covering layer is patterned into an island shape using a manufacturing technique such as etching to thereby form the semiconductor layer of the photoelectric conversion element, and thereafter, the lower electrode of the photoelectric conversion element is formed by patterning the conductive layer.

In the technique disclosed in JP-A-2014-78651, the conductive layer (lower electrode) underlying the covering layer is in an exposed state in the step of patterning the covering layer. Hence, a conductive material is dissociated from the conductive layer due to, for example, adhesion of an etching solution used for patterning the covering layer, and thus there is a possibility that the conductive material adheres to the surface or side face of the semiconductor layer and forms the path of a leakage current.

SUMMARY

An advantage of some aspects of the invention is to reduce a possibility that, in the step of forming a semiconductor layer of a photoelectric conversion element, a conductive material of an electrode adheres to the semiconductor layer.

A preferred aspect of the invention is directed to a method of manufacturing a photoelectric conversion element including a semiconductor layer, the method including: forming an electrode; forming an insulating layer covering the electrode; forming an opening in a region of the insulating layer overlapping the electrode in a plan view; forming a covering layer of a semiconductor material on a surface of the insulating layer; and forming the semiconductor layer by patterning the covering layer, wherein in the forming of the semiconductor layer, the semiconductor layer is formed such that an outer circumferential edge of the semiconductor layer is located on the outside of an inner circumferential edge of the opening in the plan view. In the above aspect, in the forming of the semiconductor layer by patterning the covering layer, the semiconductor layer is formed such that the outer circumferential edge of the semiconductor layer is located on the outside of the inner circumferential edge of the opening of the insulating layer in the plan view. That is, the electrode is covered by the semiconductor layer and the insulating layer in the forming of the semiconductor layer. Hence, it is possible to reduce the possibility that the conductive material of the electrode is dissociated and adheres to the semiconductor layer in the patterning for forming the semiconductor layer.

In a preferred aspect of the invention, the method further includes forming a conductive layer in which a first layer of a first conductive material and a second layer of a second conductive material (e.g., aluminum) having high light reflectivity compared with the first conductive material are stacked such that the first layer is located at a surface, wherein in the forming of the electrode, the electrode is formed of the second conductive material on the surface of the conductive layer. In the above aspect, the first layer at the surface of the conductive layer is formed of the first conductive material having low light reflectivity compared with the second conductive material of the second layer, while the electrode is formed of the second conductive material on the surface of the conductive layer. Therefore, highly efficient photoelectric conversion can be realized by reflecting light on the surface of the electrode. Moreover, since the electrode is formed on the surface of the conductive layer, there is an advantage in that a conducting defect (e.g., disconnection) between the electrode and the conductive layer is suppressed compared with the configuration in which the electrode is formed on the surface of the insulating layer covering the conductive layer and the electrode conducts to the conductive layer through a conducting hole in the insulating layer.

In a preferred aspect of the invention, in the forming of the electrode, the electrode is formed by stacking, in multiple layers, a first layer of a first conductive material and a second layer of a second conductive material (e.g., aluminum) having high light reflectivity compared with the first conductive material such that the first layer is located at a surface and that the second layer is exposed through an electrode opening that is an opening formed in the first layer at the surface, and in the forming of the opening in the insulating layer, the opening is formed in the insulating layer so as to overlap the electrode opening in the plan view. In the above aspect, since the second layer having light reflectivity is exposed through the electrode opening of the first layer located at the surface in the electrode including the first layer and the second layer stacked on one another, highly efficient photoelectric conversion can be realized by reflecting light on the surface of the second layer.

In a preferred aspect of the invention, in the forming of the electrode, the electrode is formed by stacking, in multiple layers, a first layer of a first conductive material and a second layer of a second conductive material (e.g., aluminum) having high light reflectivity compared with the first conductive material such that the first layer is located at a surface and that the second layer is exposed through an electrode opening that is an opening formed in the first layer at the surface, and in the forming of the opening in the insulating layer, the opening is formed in the insulating layer such that an inner circumferential edge of the opening is located on the inside of an inner circumferential edge of the electrode opening in the plan view. In the above aspect, since the second layer having light reflectivity is exposed through the electrode opening of the first layer located at the surface in the electrode including the first layer and the second layer stacked on one another, highly efficient photoelectric conversion can be realized by reflecting light on the surface of the second layer.

A photoelectric conversion element according to another preferred aspect of the invention includes: an electrode; an insulating layer covering the electrode and including an opening formed overlapping the electrode in a plan view; and a semiconductor layer overlapping the opening in the plan view, wherein an outer circumferential edge of the semiconductor layer is located on the outside of an inner circumferential edge of the opening in the plan view. A photoelectric conversion device according to still another preferred aspect of the invention includes the photoelectric conversion element according to the above aspect. In each of the above aspects, since the outer circumferential edge of the semiconductor layer is located on the outside of the inner circumferential edge of the opening of the insulating layer in the plan view, the electrode is covered by the insulating layer in the forming of the semiconductor layer by patterning the covering layer. Hence, it is possible to reduce the possibility that the conductive material of the electrode is dissociated and adheres to the semiconductor layer in the patterning for forming the semiconductor layer.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
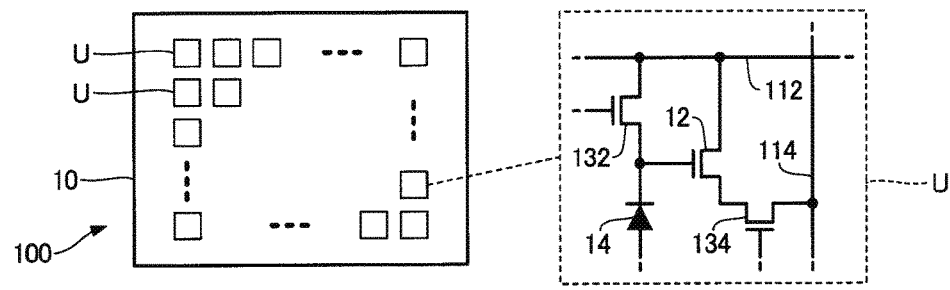
FIG. 1 is a configuration diagram of a photoelectric conversion device according to a first embodiment of the invention.

FIG. 1 is a configuration diagram of a photoelectric conversion device 100 according to a first embodiment of the invention. The photoelectric conversion device 100 is, for example, an imaging device (vein sensor) that captures a vein image of the living body for biometric authentication, and includes a substrate 10 and a plurality of unit elements U as illustrated in FIG. 1. The substrate 10 is a plate-shaped member such as a glass substrate or a quartz substrate. The plurality of unit elements U are arranged in a matrix on the face of the substrate 10.

As illustrated in FIG. 1 in which one unit element U is representatively shown, each of the unit elements U is disposed corresponding to each intersection between constant potential lines 112 and detection lines 114, and configured to include a transistor 12, a transistor 132, a transistor 134, and a photoelectric conversion element 14. The photoelectric conversion element 14 generates charge in response to the amount of light received. The photoelectric conversion element 14 of the first embodiment can receive near-infrared light (at a wavelength of from 700 nm to 1000 nm). The transistor 12 and the transistor 134 are connected in series between the constant potential line 112 and the detection line 114. The gate electrode of the transistor 12 is connected to the photoelectric conversion element 14. The transistor 132 is connected between the gate electrode of the transistor 12 and the constant potential line 112.

The potential at the gate electrode of the transistor 12 is initialized to the potential at the constant potential line 112 when the transistor 132 is controlled into the on-state, and then changes to the potential in response to the amount of light received by the photoelectric conversion element 14. Hence, when the transistor 134 is controlled into the on-state, a detection signal of a current value in response to the amount of light received by the photoelectric conversion element 14 (the potential at the gate electrode of the transistor 12) is output from the constant potential line 112 through the transistor 12 and the transistor 134 to the detection line 114. That is, the transistors (12, 132, and 134) in the unit element U are semiconductor devices used to control the input/output of the detection signal (drive the photoelectric conversion element 14). The specific configuration of the unit element U is not limited to that illustrated in FIG. 1.

Structure of Photoelectric Conversion Element 14

Figure 2:
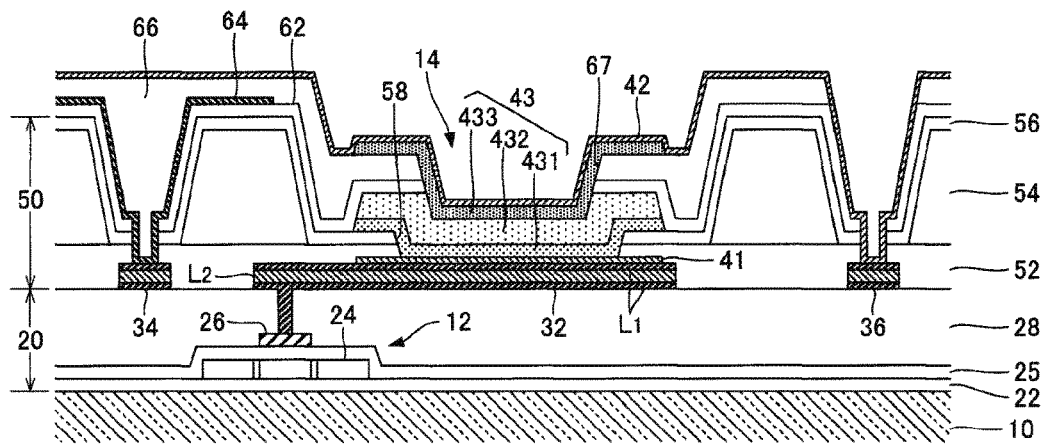
FIG. 2 is a cross-sectional view of a photoelectric conversion element.

FIG. 2 is a cross-sectional view of a portion corresponding to any one of the unit elements U in the photoelectric conversion device 100. As shown in FIG. 2, a circuit layer 20 is formed on the surface of the substrate 10. The circuit layer 20 includes an under layer 22, the plurality of transistors (12, 132, and 134), and an inter-layer insulating layer 28. The under layer 22 is formed of an insulating material such as, for example, silicon oxide ($SiO_x$) or silicon nitride ($SiN_x$).

The plurality of transistors (12, 132, and 134) in each of the unit elements U are thin film transistors having a similar configuration. The transistor 12 is representatively illustrated in FIG. 2. The transistor 12 is a thin film transistor including a semiconductor layer 24, a gate insulating layer 25, and a gate electrode 26. The semiconductor layer 24 is formed of a semiconductor material such as, for example, polysilicon in an island shape on the surface of the under layer 22. The gate electrode 26 is formed of a conductive material such as, for example, molybdenum (Mo), and opposed to the channel region of the semiconductor layer 24 with the gate insulating layer 25 interposed between the channel region and the gate electrode 26. The inter-layer insulating layer 28 is an insulating coating that covers the semiconductor layer 24 and the gate electrode 26, and formed of an insulating material such as, for example, silicon oxide or silicon nitride.

The source and drain electrodes (not shown) of the transistor 12 are formed on the surface of the circuit layer (the inter-layer insulating layer 28), and also, a conductive layer 32, a wiring layer 34, and a wiring layer 36 are formed thereon. The conductive layer 32 conducts to the gate electrode 26 of the transistor 12 through a conducting hole (contact hole) penetrating the inter-layer insulating layer 28. As illustrated in FIG. 2, the conductive layer 32 is an electrode having a structure in which first layers L1 and a second layer L2 are alternately stacked. The first layer L1 is formed of a first conductive material having a high melting point compared with the second layer L2, and the second layer L2 is formed of a second conductive material having high light reflectivity compared with the first layer L1. The first conductive material is a high-melting-point metal such as, for example, molybdenum (Mo) or titanium (Ti), and the second conductive material is a light-reflective metal including, for example, aluminum or silver. As illustrated in FIG. 2, the conductive layer 32 of the first embodiment is a stacked body having three layers in total in which the second layer L2 intervenes between the pair of first layers L1 opposed to each other and the first layer L1 having a high melting point is located at the surface. Hence, there is an advantage in that even when, for example, the conductive layer 32 is heated in the manufacturing process of the photoelectric conversion element 14, variations in the electrical characteristics of the conductive layer 32 can be suppressed. Moreover, the configuration in which the second conductive material typified by aluminum is located at the top layer has a problem in that a hillock is likely to occur on the surface. In the first embodiment, since the surface of the conductive layer 32 is formed of the first conductive material such as molybdenum or titanium, there is also an advantage in that the occurrence of the hillock can be suppressed.

The wiring layer 34 and the wiring layer 36 in FIG. 2 are formed of a stacked structure similar to that of the conductive layer 32, together with the source and drain electrodes of the transistor 12. The wiring layer 34 and the wiring layer 36 are maintained at, for example, the ground potential.

As illustrated in FIG. 2, the photoelectric conversion element 14 is a light-receiving element (photodiode) in which a photoelectric conversion layer 43 intervenes between a first electrode 41 and a second electrode 42. The first electrode 41 is a lower electrode located below the photoelectric conversion layer 43, and formed individually for each of the unit elements U. The first electrode 41 of the first embodiment is formed of the light-reflective second conductive material (e.g., a conductive material including aluminum) having a low resistance, similarly to the second layer L2 of the conductive layer 32, on the surface of the conductive layer 32. That is, the first electrode 41 is formed so as to be in contact with the surface of the first layer L1 located at the top layer in the conductive layer 32.

The surface of the circuit layer 20 on which the conductive layer 32, the wiring layer 34, and the wiring layer 36 are formed is covered with an insulating layer 50. The insulating layer 50 of the first embodiment includes a protective layer 52, a planarization layer 54, and an insulating layer 56 stacked on one another. The protective layer 52 (passivation layer) is a coating for protecting the transistor 12, and formed of an insulating material such as, for example, silicon oxide or silicon nitride. The planarization layer 54 is a coating for planarizing surface irregularities (steps) of the circuit layer 20, and formed of, for example, a light-transmitting resin material (e.g., acrylic resin). The insulating layer 56 is a coating for covering the protective layer 52 and the planarization layer 54, and formed of an insulating material such as, for example, silicon oxide or silicon nitride. The configuration in which each of the protective layer 52 and the insulating layer 56 is formed of a single layer is illustrated in FIG. 2; however, the protective layer 52 or the insulating layer 56 can be formed of a plurality of stacked layers formed of different insulating materials.

Figure 3:
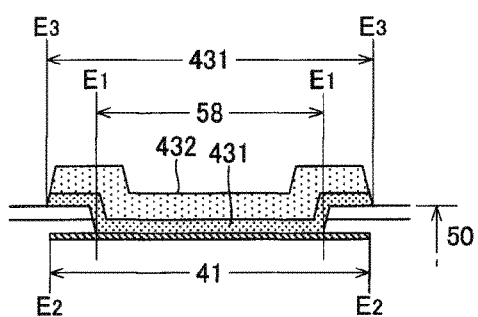
FIG. 3 is an enlarged cross-sectional view of the vicinity of a photoelectric conversion layer.

An opening 58 is individually formed for each of the unit elements U in a region of the insulating layer 50 overlapping the first electrode 41 in a plan view (i.e., as viewed in a direction vertical to the surface of the substrate 10). Specifically, the opening 58 is formed in a region of the insulating layer 50 where the protective layer 52 and the insulating layer 56 are stacked. FIG. 3 is an enlarged cross-sectional view of the vicinity of the opening 58 of the insulating layer 50. As understood from FIG. 3, an inner circumferential edge E1 of the opening 58 of the insulating layer 50 is located inside an outer circumferential edge (outline) E2 of the first electrode 41 in the plan view. That is, the region of the opening 58 of the insulating layer 50 is contained in the plan view in the range (i.e., a region where the first electrode 41 is present) surrounded by the outline of the first electrode 41. Hence, the first electrode 41 is exposed from the insulating layer 50 through the opening 58, and constitutes the bottom face of a space (recess) surrounded by the inner wall face of the opening 58.

As illustrated in FIG. 2, the photoelectric conversion layer 43 of the first embodiment is a stacked body in which a first semiconductor layer 431, an intermediate semiconductor layer 432, and a second semiconductor layer 433 are stacked in this order from the first electrode 41 side. The photoelectric conversion layer 43 is formed so as to overlap the opening 58 of the insulating layer 50 in the plan view. Hence, the first semiconductor layer 431 is in contact with the surface of the first electrode 41 inside the opening 58. The first semiconductor layer 431, the intermediate semiconductor layer 432, and the second semiconductor layer 433 are formed of semiconductor materials such as, for example, amorphous silicon. Specifically, the first semiconductor layer 431 is a lower contact layer ($n^+$ layer) formed of an n-type semiconductor, and the second semiconductor layer 433 is an upper contact layer ($p^+$ layer) formed of a p-type semiconductor. The intermediate semiconductor layer 432 intervening between the first semiconductor layer 431 and the second semiconductor layer 433 is a semiconductor layer (i layer) formed of an intrinsic semiconductor. As understood from the above description, the photoelectric conversion element 14 of the first embodiment is a PIN-type diode with the first electrode 41 being as a cathode. The first semiconductor layer 431 can be formed of a p-type semiconductor, and the second semiconductor layer 433 can be formed of an n-type semiconductor.

As understood from FIG. 3, an outer circumferential edge (outline) E3 of the first semiconductor layer 431 and the intermediate semiconductor layer 432 is located outside the inner circumferential edge E1 of the opening 58 of the insulating layer 50 in the plan view. That is, the region where the opening 58 is formed is contained in the plan view in the range (the region where the photoelectric conversion layer 43 is present) surrounded by the outline of the first semiconductor layer 431 and the intermediate semiconductor layer 432. Hence, the first semiconductor layer 431 covers the surface of the first electrode 41 exposed from the insulating layer 50 inside the opening 58 and the inner wall face of the opening 58, reaches the surface of the insulating layer 50, and covers an annular or frame-shaped region of the surface located in the vicinity of the inner circumferential edge E1 of the opening 58.

As illustrated in FIG. 2, the surface of the insulating layer 50 on which the first semiconductor layer 431 and the intermediate semiconductor layer 432 are formed is covered with an insulating layer 62. The insulating layer 62 is formed of an insulating material such as, for example, silicon oxide or silicon nitride. A light-shielding layer 64 is formed on the surface of the insulating layer 62. The light-shielding layer 64 is formed of a light-shielding conductive material (e.g., chromium), and conducts to the wiring layer 34 through a conducting hole penetrating the insulating layer 50 and the insulating layer 62. Hence, the light-shielding layer 64 is maintained at the ground potential. Since the light directed to the transistor 12 is blocked by the light-shielding layer 64, a leakage current of the transistor 12 due to light irradiation can be suppressed. The configuration in which the light-shielding layer 64 is formed on the surface of the planarization layer 54 of a resin material has a problem in that the light-shielding layer 64 is likely to detach from the surface of the planarization layer 54. In the first embodiment, since the light-shielding layer 64 is formed on the surface of the insulating layer 62 covering the planarization layer 54, there is also an advantage in that the detachment of the light-shielding layer 64 can be suppressed.

The surface of the insulating layer 62 on which the light-shielding layer 64 is formed is covered with an insulating layer 66. The insulating layer 66 is formed of an insulating material such as, for example, silicon oxide or silicon nitride. As illustrated in FIG. 2, an opening 67 similar to that of the insulating layer 50 is formed in the insulating layer 62 and the insulating layer 66. That is, the intermediate semiconductor layer 432 is exposed from the insulating layer 62 and the insulating layer 66 through the opening 67. The second semiconductor layer 433 is formed so as to overlap the opening 67 in the plan view. Hence, the second semiconductor layer 433 is in contact with the surface of the intermediate semiconductor layer 432 inside the opening 67. The photoelectric conversion layer 43 is formed of the first semiconductor layer 431, the intermediate semiconductor layer 432, and the second semiconductor layer 433 stacked on one another as described above.

The second electrode 42 is formed on the surface of the insulating layer 66 on which the second semiconductor layer 433 is formed. The second electrode 42 is an upper electrode formed of a light-transmitting conductive material such as, for example, indium tin oxide (ITO) or indium zinc oxide (IZO) on the surface of the insulating layer 66, and functions as an anode of the photoelectric conversion element 14. The second electrode 42 is continuously formed over the plurality of unit elements U, and conducts to the wiring layer 36 through a conducting hole penetrating the insulating layer 50, the insulating layer 62, and the insulating layer 66. Hence, the second electrode 42 is maintained at the ground potential.

Method of Manufacturing Photoelectric Conversion Element 14

Figure 4:
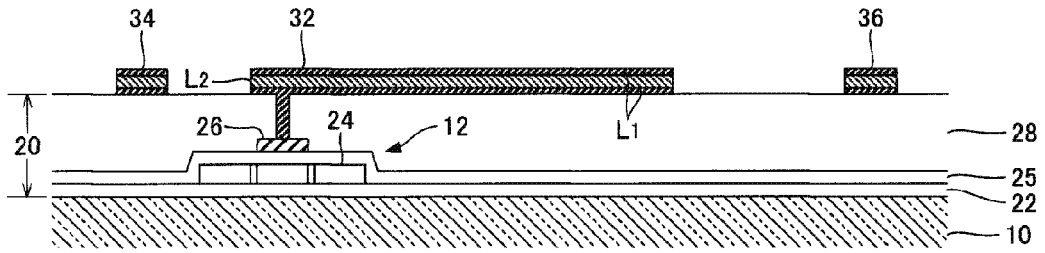
FIG. 4 is an explanatory view of the step of forming a conductive layer.
Figure 5:
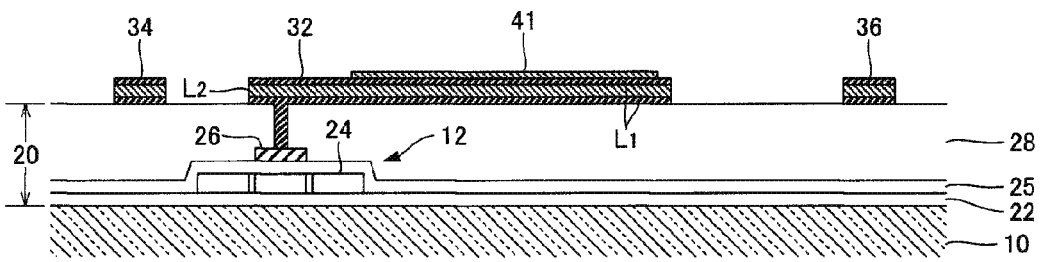
FIG. 5 is an explanatory view of the step of forming a first electrode.

FIGS. 4 to 11 are explanatory views of the manufacturing process of the photoelectric conversion element 14 of the first embodiment. Step P1 in FIG. 4 starts at a stage where the circuit layer 20 is formed on the surface of the substrate 10. As illustrated in FIG. 4, in the first Step P1 (step of forming a conductive layer), the conductive layer 32, the wiring layer 34, and the wiring layer 36 are formed on the surface of the circuit layer 20 by a publicly known deposition technique such as sputtering. In Step P2 (step of forming an electrode) after carrying out Step P1, the first electrode 41 is formed of the light-reflective second conductive material such as aluminum on the surface of the conductive layer 32 as illustrated in FIG. 5. For the formation of the first electrode 41, a publicly known deposition technique such as sputtering and a publicly known processing technique such as photolithography and etching are used.

Figure 6:
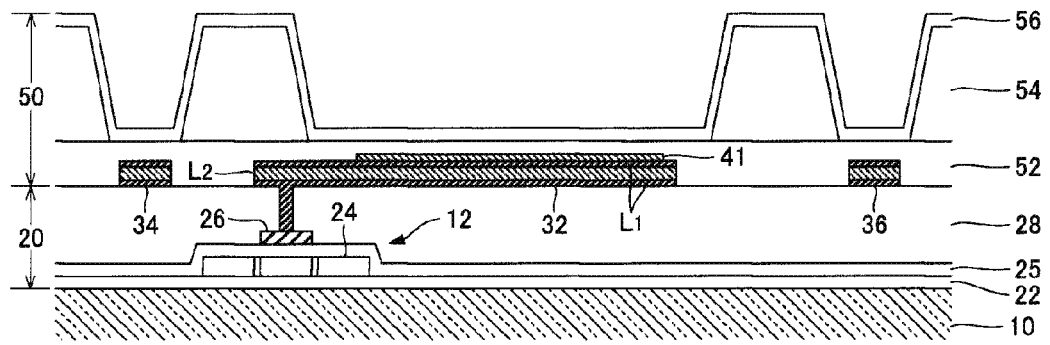
FIG. 6 is an explanatory view of the step of forming an insulating layer.

In Step P3 (step of forming an insulating layer) after carrying out Step P2, the insulating layer 50 covering the first electrode 41 is formed as illustrated in FIG. 6. Specifically, Step P3 includes the step of forming the protective layer 52 over the entire face of the circuit layer 20, the step of forming the planarization layer 54 on the surface of the protective layer 52, and the step of forming the insulating layer 56 covering the protective layer 52 and the planarization layer 54. A publicly known deposition technique such as, for example, chemical vapor deposition (CVD) is used for the formation of the protective layer 52 and the insulating layer 56, and a deposition technique such as, for example, spin-coating is used for the formation of the planarization layer 54.

Figure 7:
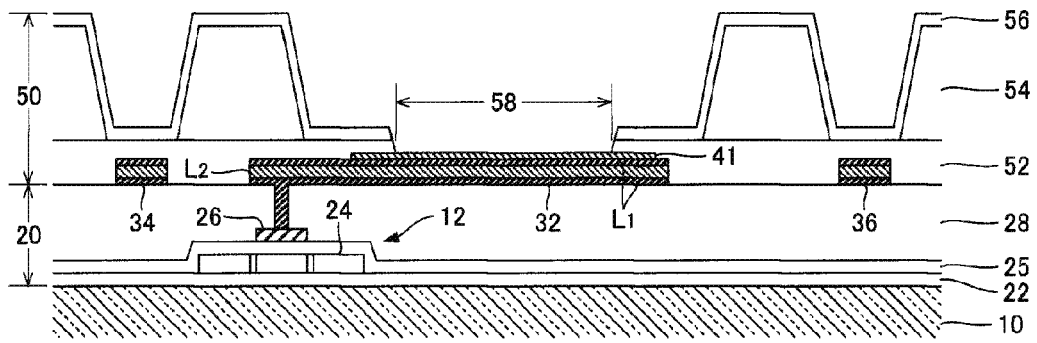
FIG. 7 is an explanatory view of the step of forming an opening.

In Step P4 (step of forming an opening) after carrying out Step P3, the opening 58 is formed in a region of the insulating layer 50 overlapping the first electrode 41 in the plan view as illustrated in FIG. 7. A publicly known processing technique such as, for example, photolithography and etching is used for the formation of the opening 58. As described above with reference to FIG. 3, the inner circumferential edge E1 of the opening 58 of the insulating layer 50 is located inside the outer circumferential edge E2 of the first electrode 41 in the plan view.

Figure 8:
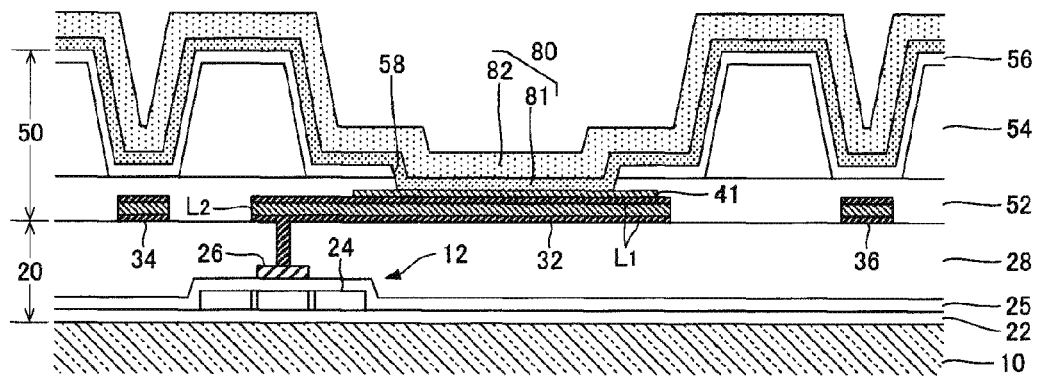
FIG. 8 is an explanatory view of the step of forming a covering layer of a semiconductor material.

In Step P5 (step of forming a covering layer) after carrying out Step P4, a covering layer 80 of a semiconductor material is formed on the surface of the insulating layer 50 as illustrated in FIG. 8. The covering layer 80 is a stacked body including a first layer 81 serving as the first semiconductor layer 431 and a second layer 82 serving as the intermediate semiconductor layer 432. The covering layer 80 is in contact with the first electrode 41 inside the opening 58 formed in Step P4, and is continuous over the entire surface of the insulating layer 50. A publicly known deposition technique such as, for example, sputtering is used for the formation of the covering layer 80.

Figure 9:
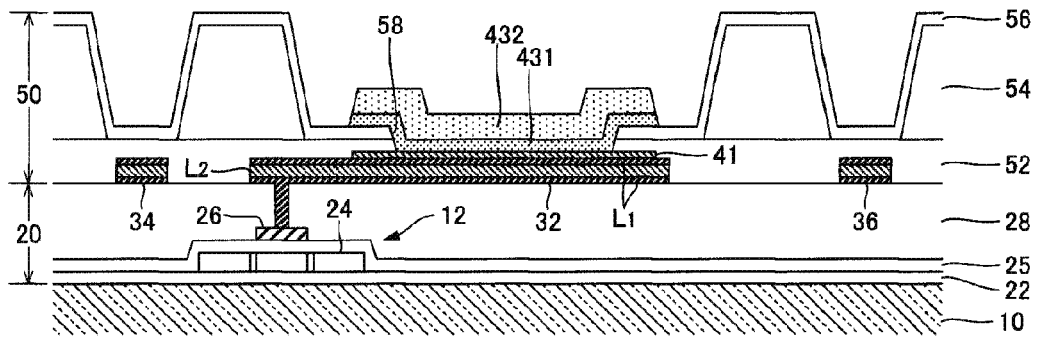
FIG. 9 is an explanatory view of the step of forming a first semiconductor layer and an intermediate semiconductor layer.

In Step P6 (step of forming a semiconductor layer) after carrying out Step P5, the first semiconductor layer 431 and the intermediate semiconductor layer 432 of the photoelectric conversion layer 43 are formed, as illustrated in FIG. 9, by patterning the covering layer 80 formed in Step P5. A publicly known processing technique such as, for example, photolithography and etching is used for the patterning of the covering layer 80. In Step P6, the first semiconductor layer 431 and the intermediate semiconductor layer 432 are formed by patterning the covering layer 80 such that the outer circumferential edge E3 of the semiconductor layer is located on the outside of the inner circumferential edge E1 of the opening 58 in the plan view. Hence, the first electrode 41 is in the state of being sealed by the insulating layer 50 and the first semiconductor layer 431.

Figure 10:
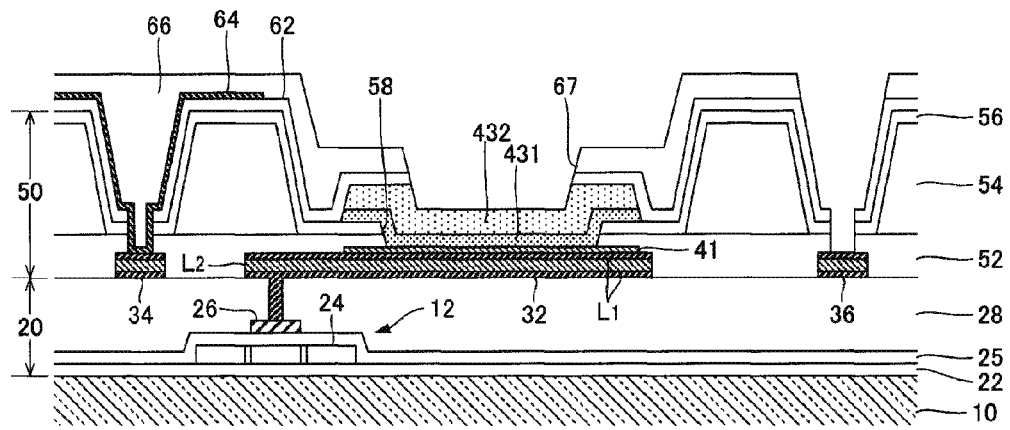
FIG. 10 is an explanatory view of the step of forming an insulating layer and a light-shielding layer.
Figure 11:
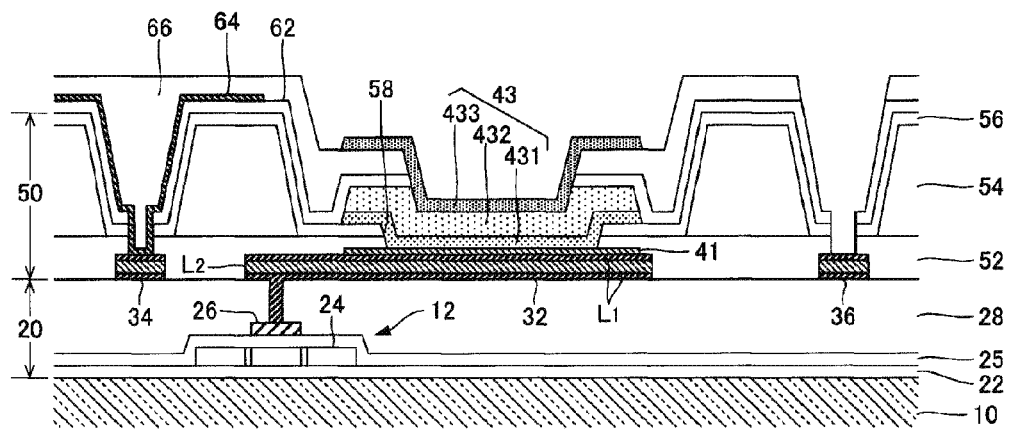
FIG. 11 is an explanatory view of the step of forming a second semiconductor layer.

In Step P7 after carrying out Step P6, the insulating layer 62, the light-shielding layer 64, and the insulating layer 66 are successively formed by a publicly known deposition technique as illustrated in FIG. 10, and the opening 67 extending through the insulating layer 62 and the insulating layer 66 is formed so as to overlap the first electrode 41 in the plan view. In Step P8 after carrying out Step P7, the second semiconductor layer 433 is formed by depositing and patterning the semiconductor material covering the insulating layer 62 and the insulating layer 66 as illustrated in FIG. 11. That is, the photoelectric conversion layer 43 including the first semiconductor layer 431, the intermediate semiconductor layer 432, and the second semiconductor layer 433 stacked on one another is formed in Step P8. Then, the second electrode 42 is formed over the plurality of unit elements U so as to cover the second semiconductor layer 433 and the insulating layer 66, so that the photoelectric conversion element 14 illustrated in FIG. 2 is formed.

As illustrated above, since the first electrode 41 is in the state of being covered by the insulating layer 50, the first semiconductor layer 431, and the intermediate semiconductor layer 432 in Step P6 (FIG. 9) of the first embodiment, a possibility that an etching solution used for patterning of the covering layer 80 adheres to the first electrode 41 is reduced. Hence, a possibility that a conductive material dissociated from the conductive layer 32 due to the adhesion of the etching solution adheres to the surface or side face of the first semiconductor layer 431 and the intermediate semiconductor layer 432 is reduced, and as a result, for example, the occurrence of a current leakage in the photoelectric conversion element 14 can be suppressed. Moreover, the first layer L1 at the surface of the conductive layer 32 is formed of the first conductive material having low light reflectivity compared with the second conductive material of the second layer L2, while the first electrode 41 is formed of the light-reflective second conductive material on the surface of the conductive layer 32. Therefore, highly efficient photoelectric conversion can be realized by reflecting light on the surface of the first electrode 41.

Second Embodiment

A second embodiment of the invention will be described. In each embodiment illustrated below, elements whose operations or functions are similar to those of the first embodiment are denoted by the same reference numerals and signs described in the first embodiment, and the detailed descriptions thereof are appropriately omitted.

Figure 12:
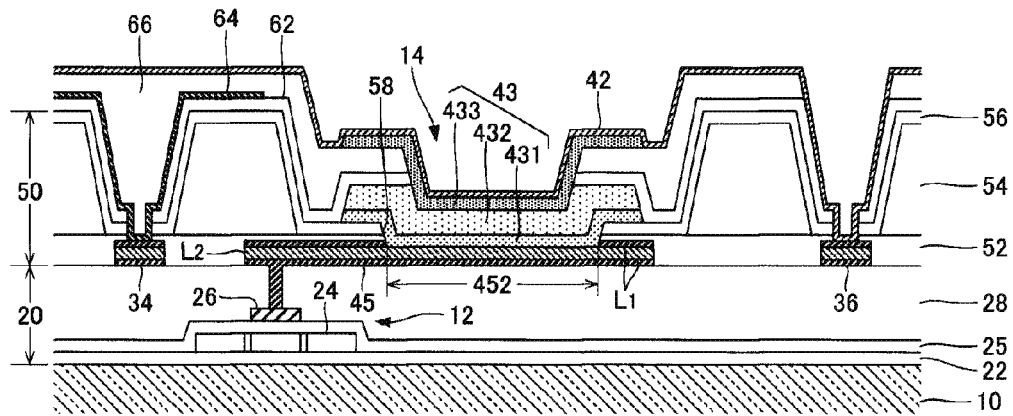
FIG. 12 is a cross-sectional view of a photoelectric conversion element in a second embodiment.

FIG. 12 is a cross-sectional view illustrating the configuration of a photoelectric conversion device 100 of the second embodiment. As illustrated in FIG. 12, the conductive layer 32 and the first electrode 41 of the first embodiment are replaced by a first electrode 45 of FIG. 12 in the second embodiment. The first electrode 45 of the second embodiment is a stacked body in which the first layers L1 formed of the first conductive material having a high melting point and the second layer L2 formed of the light-reflective second conductive material are stacked such that the first layer L1 is located at the surface. Specifically, the first electrode 45 illustrated in FIG. 12 includes three layers in total in which the second layer L2 intervenes between the pair of first layers L1 opposed to each other. As illustrated in FIG. 12, an opening (hereinafter referred to as "electrode opening") 452 is formed in the first layer L1 located on the surface layer side in the first electrode 45. Hence, the surface of the second layer L2 is exposed through the electrode opening 452 of the first layer L1.

As illustrated in FIG. 12, the opening 58 is formed in a region overlapping the electrode opening 452 of the first electrode 45 in the plan view in the insulating layer 50 (the protective layer 52 and the insulating layer 56) of the second embodiment. Hence, the surface of the second layer L2 located inside the electrode opening 452 in the plan view in the first electrode 45 is exposed inside the opening 58 of the insulating layer 50.

Similarly to the first embodiment, the first semiconductor layer 431 is formed so as to overlap the opening 58 of the insulating layer 50 in the plan view. Hence, inside the opening 58, the first semiconductor layer 431 is in contact with the surface of the second layer L2 exposed inside the electrode opening 452 in the first electrode 45. The configuration in which the outer circumferential edge E3 of the first semiconductor layer 431 and the intermediate semiconductor layer 432 is located outside the inner circumferential edge E1 of the opening 58 of the insulating layer 50 in the plan view is similar to that of the first embodiment.

Figure 13:
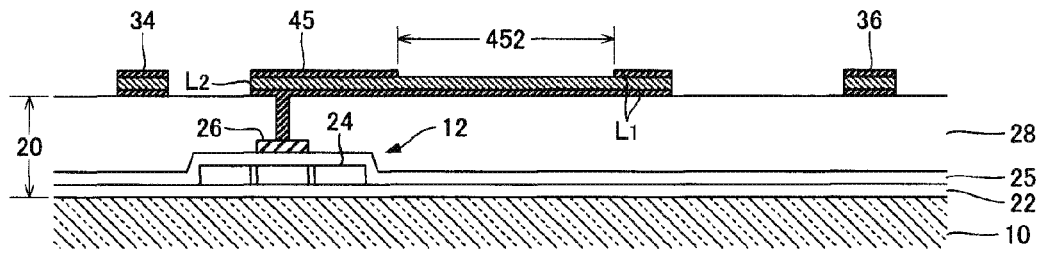
FIG. 13 is an explanatory view of the step of forming an electrode in the second embodiment.

In the manufacturing process of the photoelectric conversion element 14 of the second embodiment, Step P1 and Step P2 in the first embodiment are replaced by Step PA in FIG. 13. In Step PA (step of forming an electrode), the first electrode 45 including the first layers L1 and the second layer L2 stacked in multiple layers is formed such that the second layer L2 is exposed through the electrode opening 452 formed in the first layer L1 at the top layer. Moreover, in Step P4 (step of forming an opening in the insulating layer), the opening 58 is formed in the insulating layer 50 so as to overlap the electrode opening 452 in the plan view.

Also in the second embodiment, similarly to the first embodiment, since the first electrode 45 is in the state of being covered with the insulating layer 50 and the semiconductor layer in Step P6 where the first semiconductor layer 431 and the intermediate semiconductor layer 432 are formed by patterning the covering layer 80, it is possible to reduce the possibility that the etching solution used for patterning of the covering layer 80 adheres to the first electrode 45. Moreover, since the second layer L2 having light reflectivity is exposed through the electrode opening 452 of the first layer L1 located on the surface layer side in the electrode including the first layers L1 and the second layer L2 stacked on one another, highly efficient photoelectric conversion can be realized by reflecting light on the surface of the second layer L2.

Figure 14:
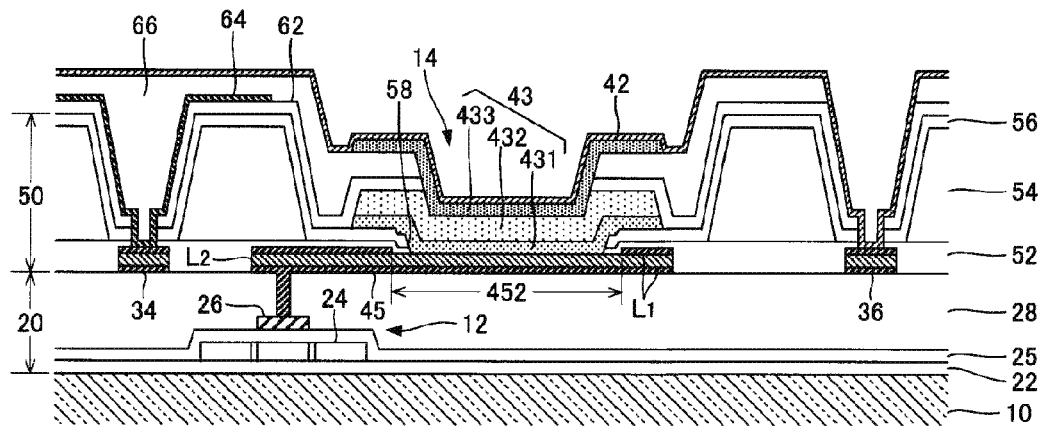
FIG. 14 is a cross-sectional view of a photoelectric conversion element in a modified example of the second embodiment.

In FIG. 12, the configuration in which the inner circumferential edge E1 of the opening 58 of the insulating layer 50 is substantially coincident with the inner circumferential edge of the electrode opening 452 in the plan view is illustrated; however, the planar relationship between the opening 58 and the electrode opening 452 is not limited to that illustrated above. For example, as illustrated in FIG. 14, the opening 58 can be formed in the insulating layer 50 in Step P4 (step of forming an opening in the insulating layer) such that the inner circumferential edge E1 of the opening 58 is located on the inside of the inner circumferential edge of the electrode opening 452 in the plan view.

Third Embodiment

Figure 15:
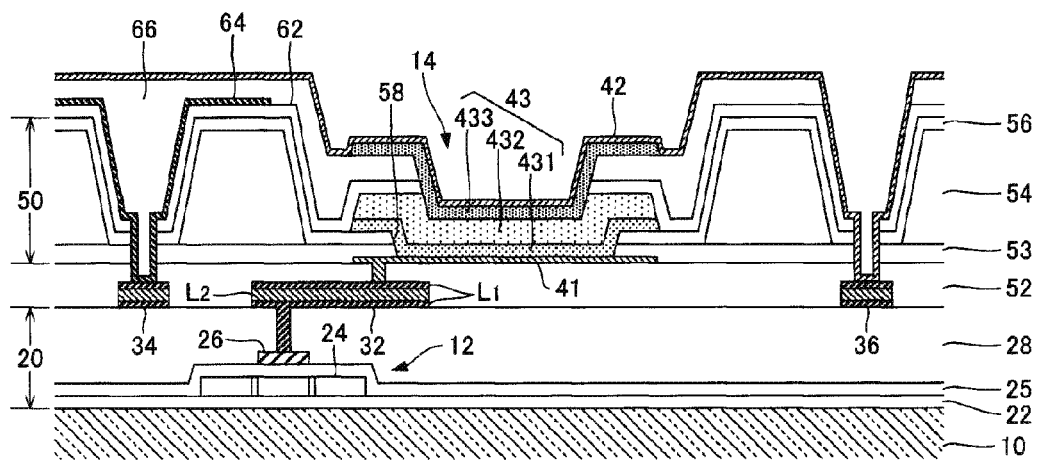
FIG. 15 is a cross-sectional view of a photoelectric conversion element in a third embodiment.

FIG. 15 is a cross-sectional view illustrating the configuration of a photoelectric conversion device 100 of a third embodiment. In the first embodiment described above, the first electrode 41 is formed on the surface of the conductive layer 32 (the surface of the first layer L1). In the third embodiment, the first electrode 41 is formed on the surface of the protective layer 52 covering the conductive layer 32, the wiring layer 34, and the wiring layer 36 as illustrated in FIG. 15. The first electrode 41 of the third embodiment is formed of the light-reflective second conductive material, similarly to the second layer L2 of the conductive layer 32, and conducts to the conductive layer 32 through a conducting hole formed in the protective layer 52.

As illustrated in FIG. 15, the insulating layer 50 of the third embodiment includes an insulating layer 53, the planarization layer 54, and the insulating layer 62. The insulating layer 53 is formed on the surface of the protective layer 52 and covers the first electrode 41. The configuration in which the opening 58 is formed in the insulating layer 50 (the insulating layer 53 and the insulating layer 56), and the configuration in which the outer circumferential edge E3 of the first semiconductor layer 431 and the intermediate semiconductor layer 432 is located outside the inner circumferential edge E1 of the opening 58 in the plan view are similar to those of the first embodiment. Hence, advantageous effects similar to those of the first embodiment are realized also in the third embodiment.

Fourth Embodiment

Figure 16:
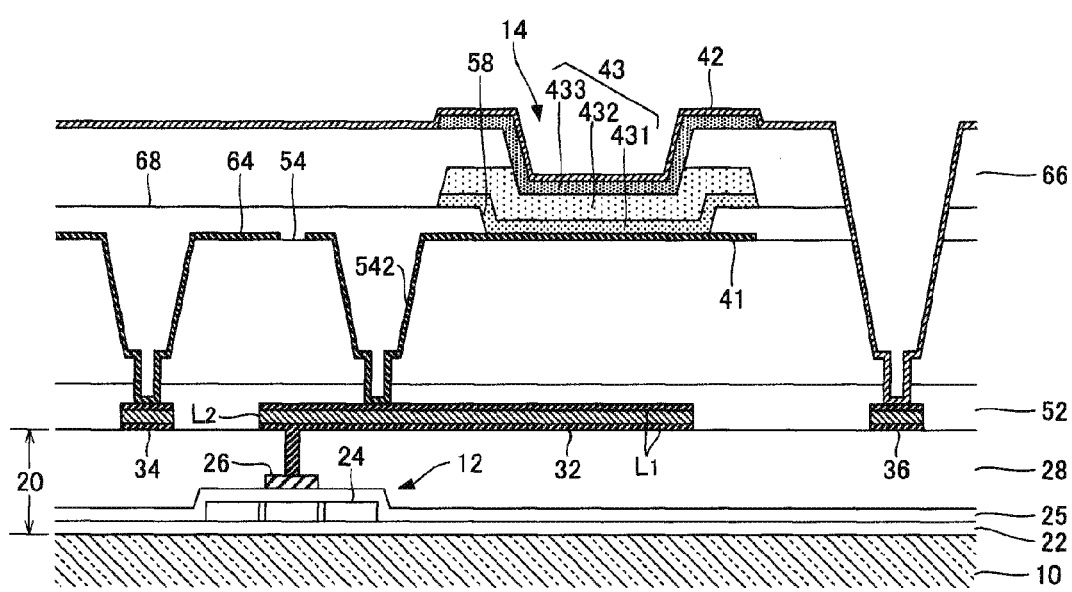
FIG. 16 is a cross-sectional view of a photoelectric conversion element in a fourth embodiment.

FIG. 16 is a cross-sectional view illustrating the configuration of a photoelectric conversion device 100 of a fourth embodiment. As understood from FIG. 16, the photoelectric conversion element 14 (the first electrode 41, the photoelectric conversion layer 43, and the second electrode 42) is formed on the face of the planarization layer 54 in the fourth embodiment.

Similarly to the first embodiment, the first electrode 41 is formed of the light-reflective second conductive material on the surface of the planarization layer 54, and conducts to the conductive layer 32 through a conducting hole 542 formed in the planarization layer 54. The first electrode 41 and the light-shielding layer 64 are collectively formed by, for example, patterning a common conductive film.

The surface of the planarization layer 54 on which the first electrode 41 is formed is covered with an insulating layer 68. The insulating layer 68 is formed of, for example, silicon oxide or silicon nitride. The opening 58 is formed in a region of the insulating layer 68 overlapping the first electrode 41, and the surface of the first electrode 41 is exposed inside the opening 58. Moreover, the first semiconductor layer 431 and the intermediate semiconductor layer 432 of the photoelectric conversion layer 43 are formed so as to overlap the opening 58 in the plan view. Hence, the first semiconductor layer 431 is in contact with the surface of the first electrode 41 inside the opening 58. The outer circumferential edge of the first semiconductor layer 431 is located outside the inner circumferential edge of the opening 58 of the insulating layer 68. Hence, advantageous effects similar to those of the first embodiment are realized also in the fourth embodiment. Other configurations are similar to those of the first embodiment.

In the configuration in which the first electrode 41 conducts to the conductive layer 32 through the conducting hole formed in the insulating layer (the protective layer 52 in FIG. 15 or the planarization layer 54 in FIG. 16) as in the third embodiment and the fourth embodiment, a conductive film is thin on the face of the inner wall face of the conducting hole, and thus a conducting defect (e.g., disconnection) may occur between the first electrode 41 and the conductive layer 32. In contrast to the third embodiment or the fourth embodiment, the first electrode 41 is formed on the surface of the conductive layer 32 in the first embodiment described above, and therefore, the first electrode 41 and the conductive layer 32 do not need to conduct to each other through the conducting hole in the insulating layer. Hence, according to the first embodiment, there is an advantage in that a conducting defect between the first electrode 41 and the conductive layer 32 can be suppressed compared with the third embodiment or the fourth embodiment. Also in the second embodiment in which the conductive layer 32 itself is used as the first electrode 45 of the photoelectric conversion element 14, the first electrode 45 and the conductive layer 32 do not need to conduct to each other through the conducting hole similarly to the first embodiment, and therefore, a conducting defect between the first electrode 45 and the conductive layer 32 can be suppressed.

MODIFIED EXAMPLES

The embodiments illustrated above may be variously modified. The forms of specific modifications will be illustrated below.

(1) The configuration of the photoelectric conversion layer 43 is not limited to that illustrated in each of the embodiments described above. For example, the photoelectric conversion layer 43 can be formed by omitting the intermediate semiconductor layer 432 and stacking the first semiconductor layer 431 and the second semiconductor layer 433 (PN-type diode). Moreover, the configuration in which the semiconductor layer of the photoelectric conversion layer 43 is formed of a chalcopyrite semiconductor may be employed.

(2) In the embodiments described above, the photoelectric conversion device 100 (vein sensor) capturing a vein image for biometric authentication has been illustrated; however, any application of the invention may be made. For example, the photoelectric conversion device 100 can also be used for obtaining biological information including a fingerprint or an iris in addition to a vein image. Moreover, the invention may be applied to a medical device such as, for example, an alcohol detector that estimates a blood alcohol level from the vein image of the living body captured by the photoelectric conversion device 100, or a blood sugar level estimating device that estimates a blood sugar level from the vein image of the living body captured by the photoelectric conversion device 100. Moreover, the invention can be applied to an image reading device that reads an image from a printed matter. When the invention is applied to the image reading device, visible light is preferably used as imaging light. The application of the photoelectric conversion element 14 is not limited to capturing of images. For example, the photoelectric conversion element 14 according to each of the embodiments described above can be used for a solar cell for converting sunlight into electric energy and storing the electric energy.

The entire disclosure of Japanese Patent Application No. 2015-248014 filed on Dec. 18, 2015 is hereby incorporated herein by reference.

What is claimed is:
1. A photoelectric conversion element comprising:
a substrate;
a transistor that is provided on the substrate;
a first insulating layer that is provided on the substrate and the transistor;
a first opening that is provided in the first insulating layer so as to expose a top surface of a gate electrode of the transistor;
a first electrode layer that is provided on the first insulating layer and in the first opening so that the first electrode layer is connected to the gate electrode;
a second insulating layer that is provided on the first electrode layer and the first insulating layer;
a second opening that is provided in the second insulating layer so as to expose a top surface of the first electrode layer;
a semiconductor layer that is provide on the second insulating layer and in the second opening so that the semiconductor layer is connected to the first electrode layer;
a third insulating layer that is provided on the semiconductor layer and the second insulating layer;
a third opening that is provided in the third insulating layer so as to expose a top surface of the semiconductor layer; and
a second electrode layer that is provided on the third insulating layer and in the third opening so that the second electrode layer is connected to the semiconductor layer, the second electrode layer transparent so that a light from outside passes through the second electrode layer to reach the semiconductor layer:
wherein the transistor is laterally shifted from the second and third opening in a first direction in a cross-sectional view,
the third opening is completely overlapped with the second opening in a second direction perpendicular to the first direction in the cross-sectional view, and
a length of the semiconductor layer in the first direction in the cross-sectional view is longer than a length of the second opening in the first direction in the cross-sectional view.

2. The photoelectric conversion element according to claim 1,
wherein when the semiconductor layer receives the light from outside, the semiconductor layer is configured to convert the light to an electronic potential so as to transfer the electronic potential to the gate electrode of the transistor via the first electrode layer.

* * * * *